United States Patent
Suto et al.

(10) Patent No.: US 11,062,730 B2
(45) Date of Patent: Jul. 13, 2021

(54) METHOD FOR EVALUATING MAGNETIC HEAD AND EVALUATION APPARATUS OF MAGNETIC HEAD

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hirofumi Suto, Tokyo (JP); Naoyuki Narita, Funabashi Chiba (JP); Tazumi Nagasawa, Yokohama Kanagawa (JP); Masayuki Takagishi, Tokyo (JP); Tomoyuki Maeda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/815,249

(22) Filed: Mar. 11, 2020

(65) Prior Publication Data
US 2020/0411040 A1    Dec. 31, 2020

(30) Foreign Application Priority Data
Jun. 26, 2019    (JP) .............................. JP2019-118143

(51) Int. Cl.
*G11B 5/455*    (2006.01)
*G11B 5/00*    (2006.01)
*G01R 31/28*    (2006.01)

(52) U.S. Cl.
CPC ............ *G11B 5/455* (2013.01); *G01R 31/282* (2013.01); *G11B 2005/0018* (2013.01)

(58) Field of Classification Search
CPC ... G11B 5/00; G11B 5/455; G11B 2005/0018; G11B 5/313; G11B 5/332; G11B 5/82; G11B 7/00; G11B 2005/0024; G11B 5/09
USPC ........................................... 360/75
See application file for complete search history.

(56) References Cited

U.S. PATENT DOCUMENTS

| 9,305,584 B2 * | 4/2016 | Koizumi .............. G11B 5/3146 |
| 2008/0304176 A1 | 12/2008 | Takagishi et al. |
| 2019/0088275 A1 | 3/2019 | Narita et al. |

FOREIGN PATENT DOCUMENTS

| JP | 2008-305486 A | 12/2008 |
| JP | 2019-57338 A | 4/2019 |

OTHER PUBLICATIONS

Zhu et al., "Microwave Assisted Magnetic Recording Utilizing Perpendicular Spin Torque Oscillator With Switchable Perpendicular Electrodes," IEEE Transactions on Magnetics, 46:751-757 (2010).

\* cited by examiner

*Primary Examiner* — Nabil Z Hindi
(74) *Attorney, Agent, or Firm* — Finnegan, Henderson, Farabow, Garrett & Dunner, L.L.P.

(57) ABSTRACT

According to one embodiment, a method for evaluating a magnetic head is disclosed. The method can include measuring an electrical characteristic of a current path when an alternating-current magnetic field is applied to the magnetic head. The magnetic head includes the current path. The current path includes an oscillator. The method can include, based on the electrical characteristic, deriving a frequency value relating to an oscillation frequency of the oscillator.

20 Claims, 7 Drawing Sheets

METHOD FOR EVALUATING MAGNETIC HEAD AND EVALUATION APPARATUS OF MAGNETIC HEAD

CROSS-REFERENCE TO RELATED APPLICATIONS

This application is based upon and claims the benefit of priority from Japanese Patent Application No. 2019-118143, filed on Jun. 26, 2019; the entire contents of which are incorporated herein by reference.

FIELD

Embodiments described herein relate generally to a method for evaluating a magnetic head and an evaluation apparatus of the magnetic head.

BACKGROUND

It is desirable to evaluate the oscillation frequency of an oscillator provided in a magnetic head.

DETAILED DESCRIPTION

Figure 1:
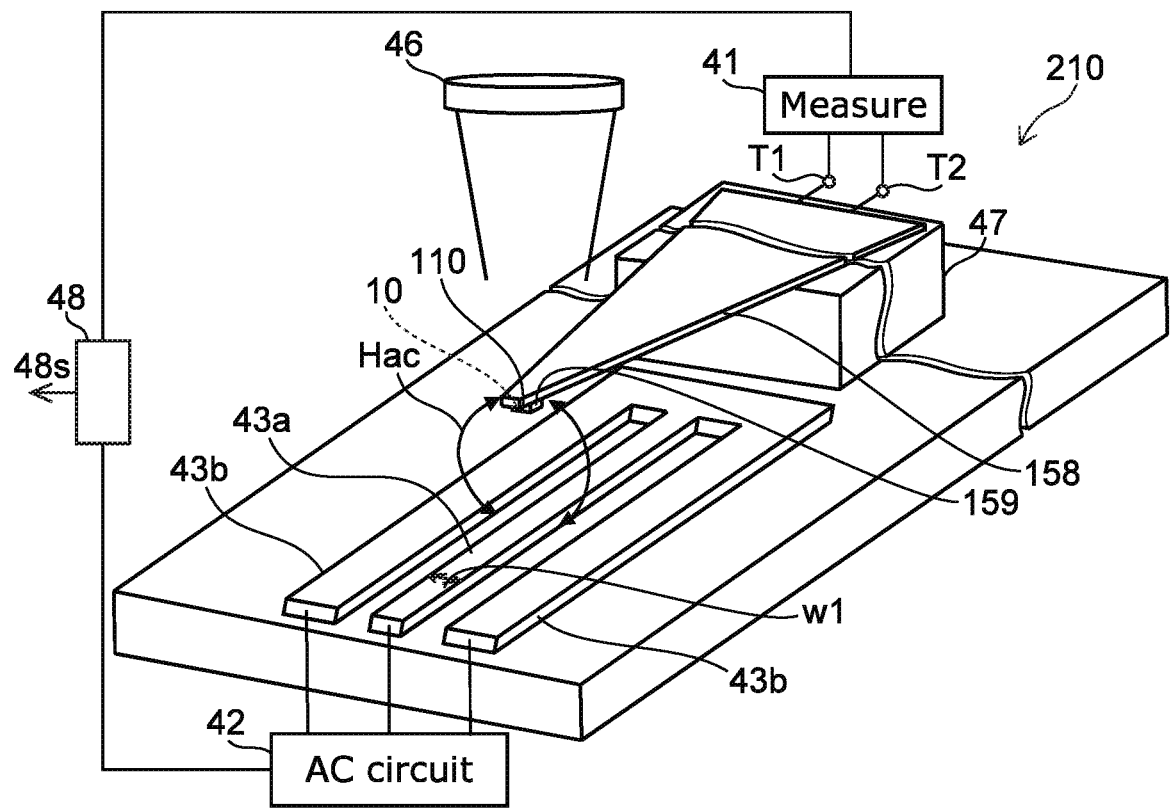
FIG. 1 is a schematic view illustrating an evaluation apparatus of a magnetic head according to a first embodiment.

According to one embodiment, a method for evaluating a magnetic head is disclosed. The method can include measuring an electrical characteristic of a current path when an alternating-current magnetic field is applied to the magnetic head. The magnetic head includes the current path. The current path includes an oscillator. The method can include, based on the electrical characteristic, deriving a frequency value relating to an oscillation frequency of the oscillator.

According to one embodiment, an evaluation apparatus of a magnetic head includes a first conductive body, a holder, a current supply circuit, and a measurement circuit. The holder is configured to hold the magnetic head and configured to control a position of the magnetic head with respect to the first conductive body. The magnetic head includes a current path including an oscillator. The current supply circuit is configured to supply an alternating current to the first conductive body. The measurement circuit is configured to measure an electrical characteristic of the current path.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating an evaluation apparatus of a magnetic head according to a first embodiment.

As shown in FIG. 1, the evaluation apparatus 210 of the magnetic head according to the embodiment includes a first conductive body 43a, a holder 47, a current supply circuit 42, and a measurement circuit 41. The evaluation apparatus 210 may further include a processor 48.

The first conductive body 43a is, for example, a conductive line. Multiple second conductive bodies 43b are provided in the example. The first conductive body 43a is between one of the multiple second conductive bodies 43b and another one of the multiple second conductive bodies 43b. The first conductive body 43a and the multiple second conductive bodies 43b are electrically connected to the current supply circuit 42. The first conductive body 43a is, for example, a signal line. The multiple second conductive bodies 43b are, for example, ground lines. In the example, the signal line and the ground lines are short-ended. In the embodiment, the first conductive body 43a may be connected to another measuring device to monitor the transmitted signal.

The current supply circuit 42 is configured to supply an alternating current to the first conductive body 43a. The current supply circuit 42 includes, for example, an alternating current circuit generating the alternating current. For example, the multiple second conductive bodies 43b are set to a fixed potential (e.g., a ground potential). By providing the multiple second conductive bodies 43b, the alternating current is supplied easily to the first conductive body 43a.

An alternating-current magnetic field Hac is generated from the first conductive body 43a according to the alternating current flowing in the first conductive body 43a. The alternating-current magnetic field Hac is, for example, a high frequency magnetic field. The frequency of the high frequency magnetic field is, for example, not less than 1 GHz and not more than 100 GHz. The alternating current is, for example, a high frequency current. The frequency of the high frequency current is, for example, not less than 1 GHz and not more than 100 GHz.

The holder 47 holds a magnetic head 110. The holder 47 is configured to control the position of the magnetic head 110 with respect to the first conductive body 43a. In the example, the magnetic head 110 is fixed to a head slider 159. The head slider 159 is fixed to a head gimbal assembly 158. The holder 47 holds the magnetic head 110 by holding the head gimbal assembly 158.

The holder 47 may include, for example, a stage including a positioner. Thereby, the position of the magnetic head 110 held by the holder 47 with respect to the first conductive body 43a can be controlled easily. The holder 47 may include, for example, a stage including a piezoelectric element. Deformation occurs in the piezoelectric element according to an electrical signal supplied to the piezoelectric element. Thereby, the position of the magnetic head 110 held by the holder 47 with respect to the first conductive body 43a can be controlled.

The magnetic head 110 includes an oscillator 10. The magnetic head 110 includes a current path. The current path includes the oscillator 10. Examples of the current path and the oscillator 10 are described below. The holder 47 holds the oscillator 10 by holding the magnetic head 110.

The measurement circuit 41 is configured to measure an electrical characteristic of the current path including the oscillator 10. The measurement circuit 41 includes, for example, an electrical circuit.

In the example, a first terminal T1 and a second terminal T2 are provided at the head gimbal assembly 158. The measurement circuit 41 is electrically connected to the first terminal T1 and the second terminal T2. The first terminal T1 and the second terminal T2 may be provided at the magnetic head 110. The measurement circuit 41 supplies a current to the current path including the oscillator 10 via the first terminal T1 and the second terminal T2. The current is, for example, a substantially direct current. The oscillator 10 oscillates when the direct current flows.

The electrical characteristic that is measured by the measurement circuit 41 corresponds to an electrical resistance of the current path including the oscillator 10 when the direct current flows in the current path. The electrical characteristic that is measured by the measurement circuit 41 may be at least one of a current or a voltage. For example, a value that corresponds to the electrical resistance of the current path can be derived from the electrical characteristic measured by the measurement circuit 41.

As described below, an alternating-current magnetic field (a high frequency magnetic field) is generated from the oscillator 10 according to the oscillation of the oscillator 10. The high frequency magnetic field is applied to a magnetic recording medium; and a magnetic characteristic of the magnetic recording medium is changed. For example, microwave assisted magnetic recording is performed by the magnetic head 110.

Based on the electrical characteristic of the current path including the oscillator 10, the processor 48 derives a frequency value relating to the oscillation frequency of the oscillator 10. A signal 48s (or data) that relates to the derived frequency value may be output from the processor 48. For example, the processor 48 outputs an estimated value of the frequency relating to the oscillation frequency of the oscillator 10. The signal 48s (or the data) may include at least a portion of the electrical characteristic measured by the measurement circuit 41. As described below, for example, the electrical characteristic may be measured while changing the frequency of the alternating-current magnetic field Hac. The signal 48s (or the data) may include the relationship between the electrical characteristic and the frequency of the alternating-current magnetic field Hac. The signal 48s (or the data) may include a graph including the relationship between the electrical characteristic and the frequency of the alternating-current magnetic field Hac, etc.

In the embodiment, the value (the frequency value) that relates to the oscillation frequency of the oscillator 10 is measured based on the electrical characteristic measured by the measurement circuit 41. Thereby, the oscillation frequency of the oscillator 10 can be measured with high accuracy. According to the embodiment, an evaluation apparatus of a magnetic head can be provided in which the oscillation frequency can be evaluated.

When the oscillator 10 oscillates, a high frequency signal can be obtained from the oscillator 10 based on a magnetoresistance effect. The high frequency signal corresponds to the change of the resistance. There is a reference example that evaluates the oscillation frequency of the oscillator 10 by evaluating the high frequency signal. The strength of the high frequency signal is weak in the reference example. Therefore, in the evaluation method of the reference example, it is difficult to stably evaluate the oscillation frequency of the oscillator 10 with high accuracy. The evaluation method of the reference example has many practical difficulties.

In the embodiment, the alternating-current magnetic field Hac that is generated according to the alternating current flowing in the first conductive body 43a is applied to the oscillator 10. A state is obtained in which the oscillation based on the direct current flowing in the oscillator 10 and the alternating-current magnetic field Hac applied to the oscillator 10 from the outside are synchronous. Or, a state is obtained in which the oscillation based on the direct current flowing in the oscillator 10 and the alternating-current magnetic field Hac are asynchronous. The oscillation frequency of the oscillator 10 can be derived by utilizing the synchronous state. Or, the oscillation frequency of the oscillator 10 can be derived by utilizing the difference between the synchronous state and the asynchronous state. According to the embodiment, the oscillation frequency of the oscillator 10 can be evaluated stably with high accuracy. According to the embodiment, a practical evaluation apparatus of a magnetic head can be provided in which the oscillation frequency can be evaluated.

As shown in FIG. 1, the first conductive body 43a has a width w1. The width w1 is, for example, the length of the first conductive body 43a along a direction (e.g., a perpendicular direction) crossing the direction in which the first conductive body 43a extends. The width w1 is, for example, the length of the first conductive body 43a along a direction (e.g., a perpendicular direction) crossing the direction of the current flowing in the first conductive body 43a. In the embodiment, it is favorable for the width w1 to be, for example, 5 μm or less. The strength of the alternating-current magnetic field Hac generated from the first conductive body 43a can be increased sufficiently thereby. For example, when the strength of the signal applied to the first conductive body 43a is 20 dBm, an alternating-current magnetic field Hac of about 100 Oe or more can be generated.

In the embodiment, the first conductive body 43a and the multiple second conductive bodies 43b include a metal. These conductive bodies include, for example, metal films.

As shown in FIG. 1, the evaluation apparatus 210 may include an optical microscope 46. By using the optical microscope 46, the position of the oscillator 10 of the magnetic head 110 may be adjusted to be proximal to the first conductive body 43a. For example, a fine alignment using a reproducing portion provided in the magnetic head 110 may be performed after a rough alignment using the optical microscope 46. In an example of the fine alignment using the reproducing portion, for example, the holder 47 may be configured to control the position of the magnetic head 110 (e.g., the oscillator 10) with respect to the first conductive body 43a based on a signal detected using the reproducing portion of the magnetic head 110 of a magnetic field generated when the current supply circuit 42 supplies a signal to the first conductive body 43a. For example, the magnetic head 110 is sensitive mainly to the magnetic field in a direction perpendicular to the ABS surface of the magnetic head 110; therefore, a strong signal is obtained at the end portion of the first conductive body 43a. The signal that is generated from the current supply circuit 42 at this time may be a direct current signal.

Several examples of the operation of the evaluation apparatus 210 of the magnetic head according to the embodiment will now be described. The operation of the evaluation apparatus 210 corresponds to an example of the evaluation method.

Second Embodiment

Figure 2:
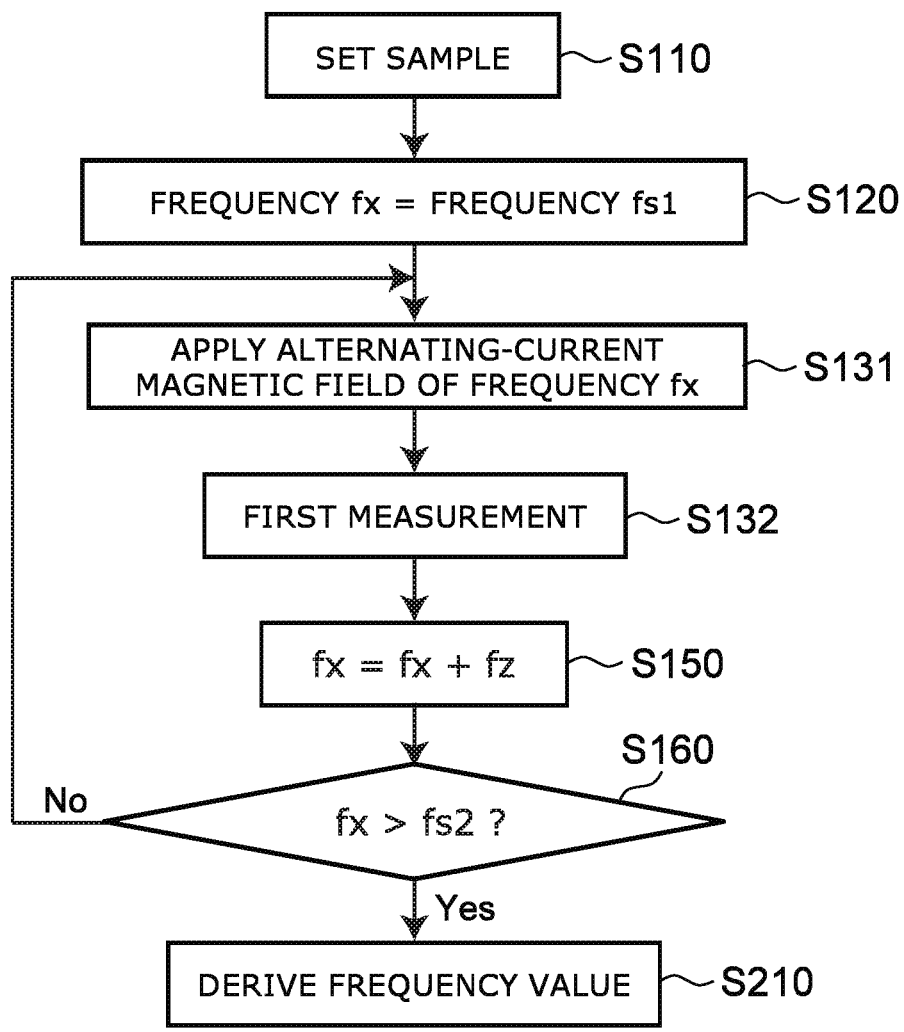
FIG. 2 is a flowchart illustrating a method for evaluating a magnetic head according to a second embodiment.

FIG. 2 is a flowchart illustrating a method for evaluating a magnetic head according to a second embodiment.

As shown in FIG. 2, the evaluation method according to the embodiment includes, for example, setting the magnetic head 110 to be evaluated in the evaluation apparatus 210 (step S110). For example, the magnetic head 110 is held by the holder 47. The oscillator 10 of the magnetic head 110 is adjusted to be proximal to the first conductive body 43a.

In the evaluation method according to the embodiment, the measurement of the electrical characteristic of the current path when the alternating-current magnetic field Hac is applied to the magnetic head 110 including the current path including the oscillator 10 is performed. For example, the measurement corresponds to performing a first measurement (step S132).

In the evaluation method according to the embodiment, the frequency value that relates to the oscillation frequency of the oscillator 10 is derived based on the measured electrical characteristic (step S210).

For example, the measurement of the electrical characteristic (e.g., the first measurement of step S132) includes measuring the electrical characteristic while modifying the frequency of the alternating-current magnetic field Hac. For example, the frequency of the alternating-current magnetic field Hac can be modified by modifying the frequency of the alternating current supplied to the first conductive body 43a from the current supply circuit 42.

For example, one of the minimum value or the maximum value of the modification range of the frequency of the alternating-current magnetic field Hac is taken as a frequency fs1. The other of the minimum value or the maximum value of the modification range of the frequency of the alternating-current magnetic field Hac is taken as a frequency fs2. The frequency fs1 and the frequency fs2 may be interchanged. Hereinbelow, the case is described where the frequency fs1 is the minimum value, and the frequency fs2 is the maximum value.

For example, as shown in FIG. 2, a frequency fx of the alternating-current magnetic field Hac is set to the frequency fs1 (step S120). The alternating-current magnetic field Hac of the frequency fx is applied to the magnetic head 110 (the oscillator 10) (step S131). Then, the measurement (the first measurement) of the electrical characteristic of the current path is performed in this state (step S132). At least a portion of step S131 may be performed simultaneously with step S132.

Subsequently, the frequency fx is modified (step S150). In the example, the sum of the frequency fx before the modification and a change value fz of the frequency is taken to be the frequency fx after the modification. The change value fz of the frequency may be positive or negative.

The frequency fx after the modification is compared to the frequency fs2 (step S160). In the example, the flow returns to step S131 when the frequency fx after the modification is not more than the frequency fs2. The flow proceeds to step S210 when the frequency fx after the modification is higher than the frequency fs2.

By such a procedure, the frequency fx is modified in the range between the frequency fs1 and the frequency fs2. The alternating-current magnetic field Hac of multiple frequencies fx modified in this range is applied (step S131); and the electrical characteristic at this time is measured (step S132).

For example, the minimum value and the maximum value of the modification of the frequency fx are within the range not less than 1 GHz and not more than 100 GHz. In one example, the frequency fs1 is 1.5 GHz; and the frequency fs2 is 3 GHz. The frequency fs1 and the frequency fs2 may be determined based on the design of the magnetic head 110 to be evaluated.

The width of the modification of the frequency fx (the change value fz of the frequency) may be determined to match the purpose. When the change value fz of the frequency is small, the evaluation is performed with high accuracy. When the change value fz of the frequency is large, the measurement time is short.

Figure 3:
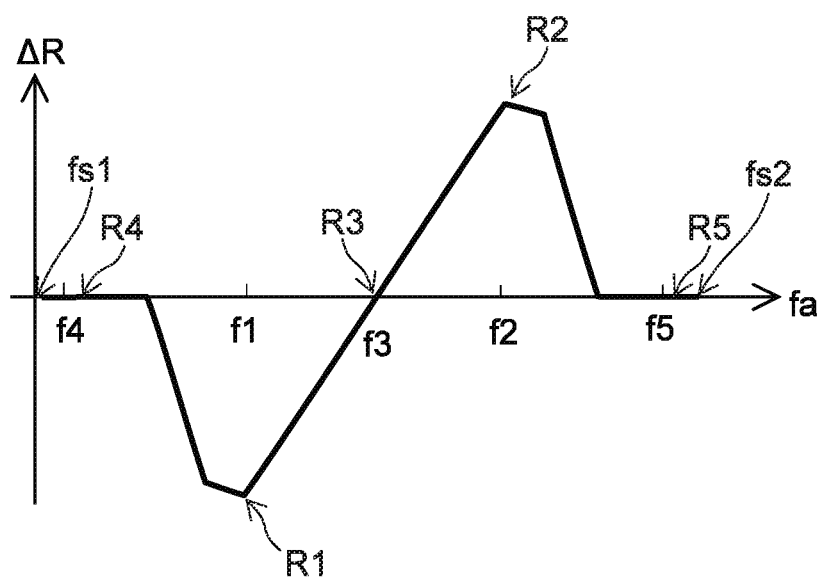
FIG. 3 is a graph illustrating a characteristic of the method for evaluating the magnetic head according to the second embodiment.

FIG. 3 is a graph illustrating a characteristic of the method for evaluating the magnetic head according to the second embodiment.

The horizontal axis of FIG. 3 is a frequency fa of the alternating current supplied to the first conductive body 43a from the current supply circuit 42. The frequency fa corresponds to the frequency of the alternating-current magnetic field Hac emitted from the oscillator 10. The vertical axis of FIG. 3 corresponds to an electrical characteristic ΔR measured by the measurement circuit 41. The electrical characteristic ΔR corresponds to the electrical characteristic of the current path including the oscillator 10. In the example, the electrical characteristic ΔR is the difference between the electrical resistance of the current path when the alternating-current magnetic field Hac is not applied and the electrical resistance of the current path when the alternating-current magnetic field Hac is applied.

In the example, the frequency fa is modified between the frequency fs1 and the frequency fs2. For example, the measurement of the electrical characteristic ΔR includes deriving a first value R1 of the electrical characteristic ΔR when a first alternating-current magnetic field of a first frequency f1 is applied to the magnetic head 110. The measurement of the electrical characteristic ΔR includes deriving a second value R2 of the electrical characteristic ΔR when a second alternating-current magnetic field of a second frequency f2 is applied to the magnetic head 110. The measurement of the electrical characteristic ΔR includes deriving a third value R3 of the electrical characteristic ΔR when a third alternating-current magnetic field of a third frequency f3 is applied to the magnetic head 110. The second frequency f2 is higher than the first frequency f1. The third frequency f3 is between the first frequency f1 and the second frequency f2. For example, the first value R1, the second value R2, and the third value R3 correspond to the change amount of the electrical resistance of the current path.

As shown in FIG. 3, the third value R3 is between the first value R1 and the second value R2.

For example, the first frequency f1 corresponds to the frequency at which one of the minimum value or the maximum value of the electrical characteristic ΔR is obtained. The second frequency f2 corresponds to the frequency at which the other of the minimum value or the maximum value of the electrical characteristic ΔR is obtained. At the first frequency f1 and the second frequency f2, the oscillation frequency of the oscillator 10 is synchronous with the frequency fa of the applied alternating-current magnetic field Hac. At the third frequency f3, the oscillation frequency of the oscillator 10 is synchronous with the frequency fa of the applied alternating-current magnetic field Hac. The third value R3 at the third frequency f3 is substantially 0. Such a third frequency f3 corresponds to the frequency value relating to the oscillation frequency of the oscillator 10. The third frequency f3 corresponds to the derived frequency value of the embodiment.

For example, at the first frequency f1, the oscillation frequency of the oscillator 10 is synchronous with the frequency fa of the alternating-current magnetic field Hac applied from the outside; therefore, the state of the oscillation of the oscillator 10 changes; and the first value R1 has a value different from 0.

For example, at the second frequency f2, the oscillation frequency of the oscillator 10 is synchronous with the frequency fa of the alternating-current magnetic field Hac applied from the outside; therefore, the state of the oscillation changes; and the second value R2 has a value different from 0.

As recited above, the value of the electrical characteristic ΔR corresponding to the frequency value relating to the oscillation frequency (in the example, the third value R3) is between the first value R1 and the second value R2.

As shown in FIG. 3, the measurement of the electrical characteristic ΔR may further include deriving a fourth value R4 of the electrical characteristic ΔR when a fourth alternating-current magnetic field of a fourth frequency f4 is applied to the magnetic head 110. The fourth frequency f4 is lower than the first frequency f1. The fourth value R4 is between the first value R1 and the second value R2.

The value of the electrical characteristic ΔR at the derived frequency value (in the example, the third frequency f3) is the third value R3. The third value R3 is proximal to the fourth value R4. For example, the absolute value of the difference between the fourth value R4 and the value of the electrical characteristic ΔR corresponding to the frequency value relating to the oscillation frequency (in the example, the third value) is less than the absolute value of the first value R1. The absolute value of the difference between the fourth value R4 and the value of the electrical characteristic ΔR corresponding to the frequency value relating to the oscillation frequency (in the example, the third value) is less than the absolute value of the second value R2.

As shown in FIG. 3, the measurement of the electrical characteristic ΔR may further include deriving a fifth value R5 of the electrical characteristic ΔR when a fifth alternating-current magnetic field of a fifth frequency f5 is applied to the magnetic head 110. The fifth frequency f5 is higher than the second frequency f2. The fifth value R5 is between the first value R1 and the second value R2.

As recited above, the value of the electrical characteristic ΔR at the derived frequency value (in the example, the third frequency f3) is the third value R3. The third value R3 is near the fifth value R5. For example, the absolute value of the difference between the fifth value R5 and the value of the electrical characteristic ΔR corresponding to the frequency value relating to the oscillation frequency (in the example, the third value) is less than the absolute value of the first value R1. The absolute value of the difference between the fifth value R5 and the value of the electrical characteristic ΔR corresponding to the frequency value relating to the oscillation frequency (in the example, the third value) is less than the absolute value of the second value R2.

For example, the first value R1 is one of the bottom value or the peak value of the electrical characteristic ΔR. For example, the second value R2 is the other of the bottom value or the peak value of the electrical characteristic ΔR. For example, at least one of the first value R1 or the second value R2 may not be the bottom value or the peak value.

In the embodiment, the measurement of the electrical characteristic ΔR may be performed repeatedly at one frequency fx. For example, a first period in which the alternating current of the frequency fx is supplied and a second period in which the alternating current is not supplied may be provided alternately for the alternating current supplied to the first conductive body 43a from the current supply circuit 42. For example, an alternating current that includes a burst oscillation signal may be supplied from the current supply circuit 42 to the first conductive body 43a. The alternating-current magnetic field Hac that includes a burst oscillation signal may be applied to the magnetic head 110. An example of such an operation will now be described.

Figure 4:
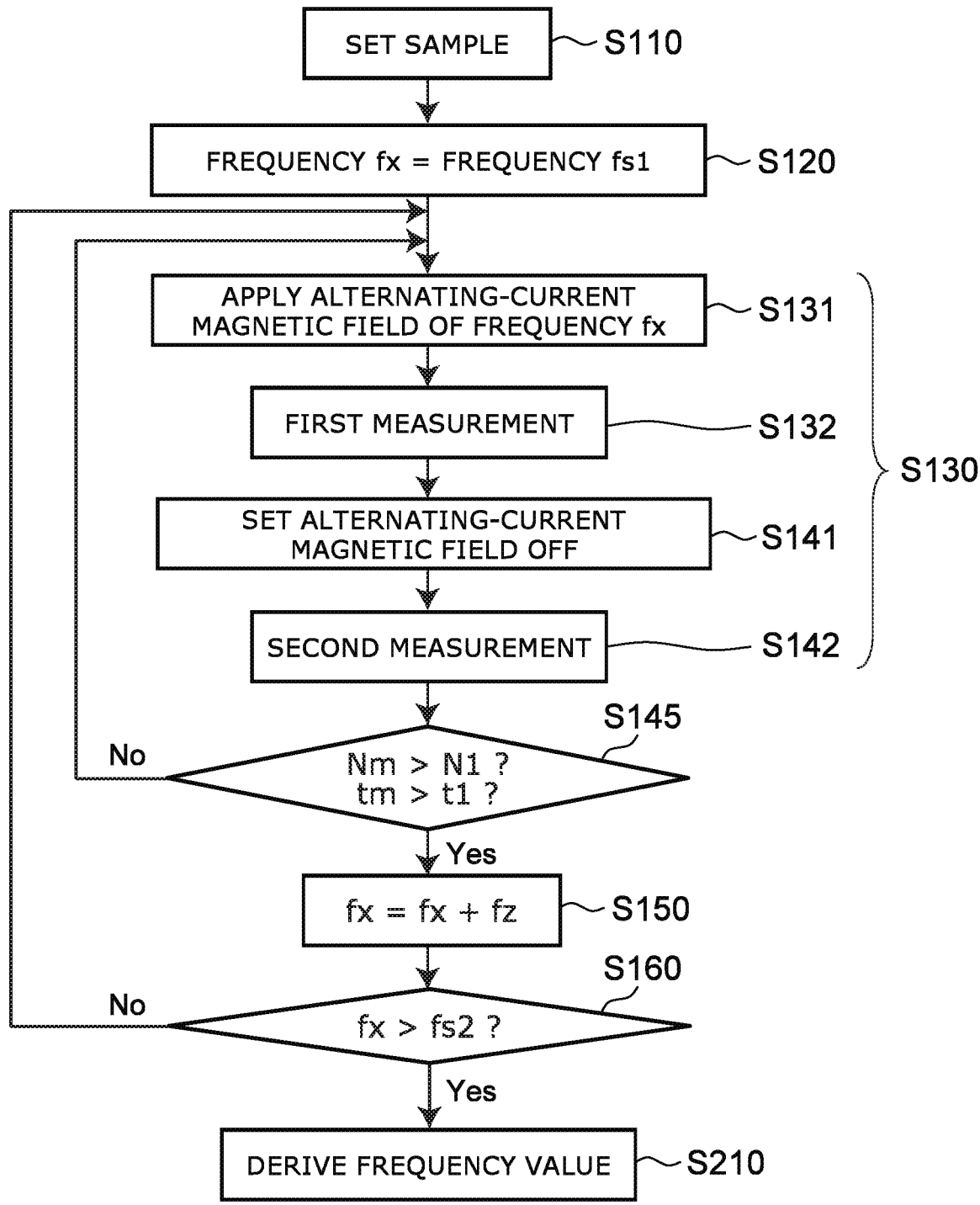
FIG. 4 is a flowchart illustrating the method for evaluating the magnetic head according to the second embodiment.

FIG. 4 is a flowchart illustrating the method for evaluating the magnetic head according to the second embodiment.

As shown in FIG. 4, the evaluation method according to the embodiment includes step S141, step S142, and step S145 in addition to step S110, step S120, step S131, step S132, step S150, step S160, and step S210 described above.

An example of step S131, step S132, step S141, step S142, and step S145 will now be described.

As shown in FIG. 4, the measurement of the electrical characteristic ΔR includes applying the alternating-current magnetic field Hac of the frequency fx to the magnetic head 110 (the oscillator 10) (step S131) and performing the first measurement of measuring the electrical characteristic ΔR of the magnetic head 110 (step S132). As described above, at least a portion of step S131 with step S132.

In the measurement of the electrical characteristic ΔR, the alternating-current magnetic field Hac is set to OFF (step S141). Or, in step S141, the strength of the alternating-current magnetic field Hac may be set to be lower than the strength of the alternating-current magnetic field Hac in the first measurement. Then, in this state, the second measurement of measuring the electrical characteristic ΔR of the magnetic head 110 is performed (step S142).

A value that is obtained from a combination of such a first measurement and such a second measurement (step S130) may be used as the electrical characteristic ΔR. The sequence of the combination of step S131 and step S132 and the combination of step S141 and step S142 is arbitrary and is interchangeable.

As shown in FIG. 4, a number Nm of performing the combination of the first measurement and the second measurement is compared to a determined value N1 (step S145). When the number Nm is not more than the value N1, the flow returns to the start of step S130 (in the example, step S131). When the number Nm exceeds the value N1, the flow proceeds to step S150.

In step S145 as shown in FIG. 4, a period tm of performing the combination of the first measurement and the second measurement may be compared to a determined value t1. When the period tm is not more than the value t1, the flow returns to the start of step S130 (in the example, step S131). When the period tm exceeds the value t1, the flow proceeds to step S150.

Thus, the measurement of the electrical characteristic ΔR may include performing multiple measurement processing (step S130 and step S145). One of the multiple measurement processing includes the first measurement and the second measurement recited above.

The multiple measurement processing may be performed periodically. For example, a burst signal that includes an alternating current repeating periodically is supplied to the magnetic head 110; and a periodic detection that is locked to the period of the burst signal is performed. A more accurate electrical characteristic is obtained. For example, there are cases where the temperature of the sample (the magnetic head 110) changes in the measurement. There are cases where the error of the derived frequency value increases due to the change of the temperature. In such a case, the effects of the temperature change, etc., are suppressed by supplying a signal including a periodically repeating alternating current to the magnetic head 110 and by using a detection locked to the period of the repeating alternating current. An accurate electrical characteristic is obtained thereby.

In the evaluation method according to the embodiment, the measurement of the electrical characteristic ΔR includes supplying an alternating current to the first conductive body 43a. The alternating-current magnetic field Hac based on the alternating current is applied to the magnetic head 110. The electrical characteristic ΔR corresponds to the electrical resistance of the current path when a direct current flows in the current path including the oscillator 10. The oscillator 10 oscillates when the direct current flows. The frequency value relating to the oscillation frequency of the oscillator 10 can be derived by utilizing the oscillation of the oscillator 10 when the direct current flows which is synchronous or asynchronous with the alternating-current magnetic field Hac based on the alternating current. According to the embodiment, a method for evaluating a magnetic head can be provided in which the oscillation frequency can be evaluated appropriately.

The evaluation method recited above is applicable to the evaluation apparatus 210 according to the embodiment. For example, the measurement of the electrical characteristic ΔR may include measuring the electrical characteristic ΔR while modifying the frequency fx of the alternating-current magnetic field Hac (referring to FIG. 2 and FIG. 3). The minimum value and the maximum value of the modification of the frequency fx is, for example, within the range not less than 1 GHz and not more than 100 GHz.

In the evaluation apparatus 210 according to the embodiment as illustrated in FIG. 3, the measurement of the electrical characteristic ΔR by the measurement circuit 41 may include deriving the first value R1 of the electrical characteristic ΔR when the first alternating-current magnetic field of the first frequency f1 is applied to the magnetic head 110, the second value R2 of the electrical characteristic ΔR when the second alternating-current magnetic field of the second frequency f2 which is higher than the first frequency f1 is applied to the magnetic head 110, and the third value R3 of the electrical characteristic ΔR when the third alternating-current magnetic field of the third frequency f3 which is between the first frequency f1 and the second frequency f2 is applied to the magnetic head 110. The third value R3 is between the first value R1 and the second value R2.

In the evaluation apparatus 210 according to the embodiment as illustrated in FIG. 3, the measurement of the electrical characteristic ΔR by the measurement circuit 41 may further include deriving the fourth value R4 of the electrical characteristic ΔR when the fourth alternating-current magnetic field of the fourth frequency f4 which is lower than the first frequency f1 is applied to the magnetic head 110. The fourth value R4 is between the first value R1 and the second value R2. The absolute value of the difference between the fourth value R4 and the value of the electrical characteristic ΔR corresponding to the frequency value relating to the oscillation frequency (e.g., the third value R3) is less than the absolute value of the first value R1 and less than the absolute value of the second value R2.

In the evaluation apparatus 210 according to the embodiment as illustrated in FIG. 3, the measurement of the electrical characteristic ΔR by the measurement circuit 41 may further include deriving the fifth value R5 of the electrical characteristic ΔR when the fifth alternating-current magnetic field of the fifth frequency f5 which is higher than the second frequency f2 is applied to the magnetic head 110. The fifth value R5 is between the first value R1 and the second value R2. The absolute value of the difference between the fifth value R5 and the value of the electrical characteristic ΔR corresponding to the frequency value relating to the oscillation frequency (e.g., the third value R3) is less than the absolute value of the first value R1 and less than the absolute value of the second value R2. The value of the electrical characteristic ΔR corresponding to the frequency value relating to the oscillation frequency (e.g., the third value R3) is between the first value R1 and the second value R2.

In the evaluation apparatus 210 according to the embodiment as shown in FIG. 4, the measurement of the electrical characteristic ΔR by the measurement circuit 41 may include the first measurement (step S132) and the second measurement (step S142). The first measurement includes measuring the electrical characteristic ΔR of the magnetic head 110 while applying the alternating-current magnetic field Hac to the magnetic head 110. The second measurement includes measuring the electrical characteristic ΔR of the magnetic head 110 while not applying the alternating-current magnetic field Hac to the magnetic head 110, or while setting the strength of the alternating-current magnetic field Hac to be lower than the strength of the alternating-current magnetic field Hac in the first measurement.

In the evaluation apparatus 210 according to the embodiment as shown in FIG. 4, the measurement of the electrical characteristic ΔR by the measurement circuit 41 may include performing multiple measurement processing (step S130). One of the multiple measurement processing includes the first measurement recited above and the second measurement recited above. In the evaluation apparatus 210 according to the embodiment, the multiple measurement processing may be performed periodically. The effects due to the temperature change, etc., are suppressed; and a more accurate electrical characteristic is obtained.

FIG. 5, FIG. 6, FIG. 7A, and FIG. 7B are schematic perspective views illustrating the magnetic head according to the embodiment.

Figure 5:
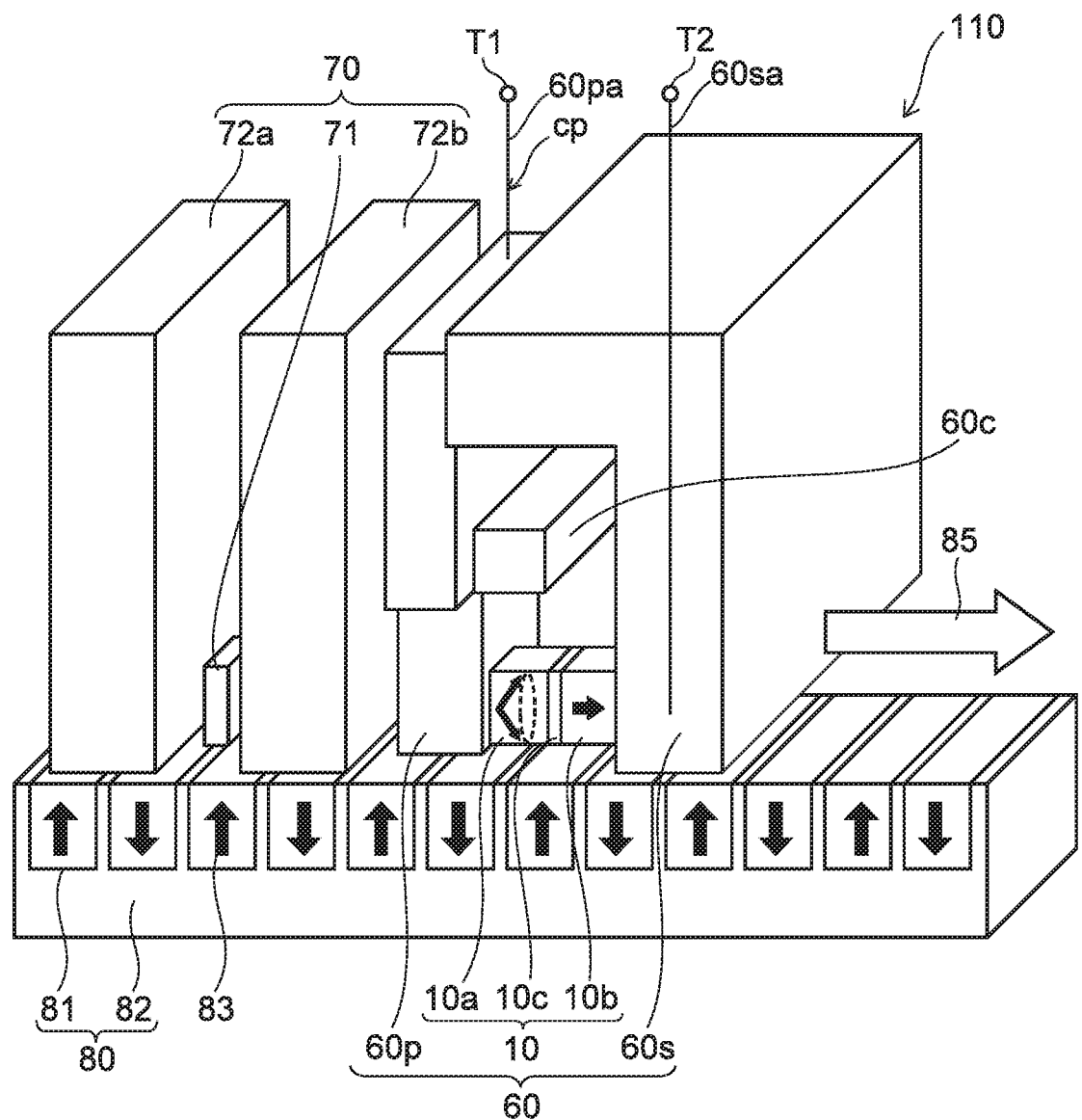
FIG. 5 is a schematic perspective view illustrating the magnetic head according to the embodiment.

As shown in FIG. 5, the magnetic head 110 includes a recording portion 60 and a reproducing portion 70. The recording portion 60 includes, for example, a magnetic pole 60p (e.g., a major magnetic pole), a coil 60c, a shield 60s, and the oscillator 10. The oscillator 10 is provided between the magnetic pole 60p and the coil 60c. The oscillator 10 includes, for example, a first magnetic layer 10a, a second magnetic layer 10b, and a nonmagnetic layer 10c. The nonmagnetic layer 10c is provided between the first magnetic layer 10a and the second magnetic layer 10b. The first magnetic layer 10a is, for example, an oscillation generation layer. The second magnetic layer 10b is, for example, a spin injection layer.

In the example, the first terminal T1 is electrically connected to the magnetic pole 60p. For example, the first terminal T1 and the magnetic pole 60p are electrically connected by wiring 60pa. The second terminal T2 is electrically connected to the shield 60s. The second terminal T2 and the shield 60s are electrically connected by wiring 60sa. The current (e.g., the direct current) that is supplied via the first terminal T1 and the second terminal T2 passes through the magnetic pole 60p and the shield 60s and is supplied to the oscillator 10. The current flows through a current path cp including the oscillator 10. The oscillator 10 oscillates due to the current.

The coil 60c is provided to be proximal to the magnetic pole 60p. A recording current is supplied to the coil 60c; and a recording magnetic field that corresponds to the recording current is applied to a recording layer 81 of a magnetic recording medium 80. For example, the recording layer 81 is provided on a magnetic recording medium substrate 82. The alternating-current magnetic field (the high frequency magnetic field) that is generated by the oscillation of the oscillator 10 is applied to the recording layer 81; and the orientation of a magnetization 83 of the magnetic recording medium 80 (the recording layer 81) changes more easily. Efficient writing is performed thereby. For example, a high recording density is obtained. The orientation of the magnetization 83 corresponds to the recorded information.

The reproducing portion 70 includes, for example, a first shield 72a, a second shield 72b, and a detector 71. The detector 71 is provided between the first shield 72a and the second shield 72b. The detector 71 includes a magnetic layer. The detector 71 includes, for example, a magnetoresistance effect element. The electrical resistance of the detector 71 changes according to the orientation of the magnetization 83 of the recording layer 81 of the magnetic recording medium 80. The information that is recorded is reproduced by evaluating the electrical resistance of the detector 71.

As shown in FIG. 5, at least one of the magnetic recording medium 80 or the magnetic head 110 including the recording portion 60 and the reproducing portion 70 moves relatively along a medium movement direction 85. The desired information (the orientation of the magnetization 83) can be recorded at any position of the magnetic recording medium 80.

As described above, the alignment between the first conductive body 43a and the magnetic head 110 may be performed using the reproducing portion 70.

Figure 6:
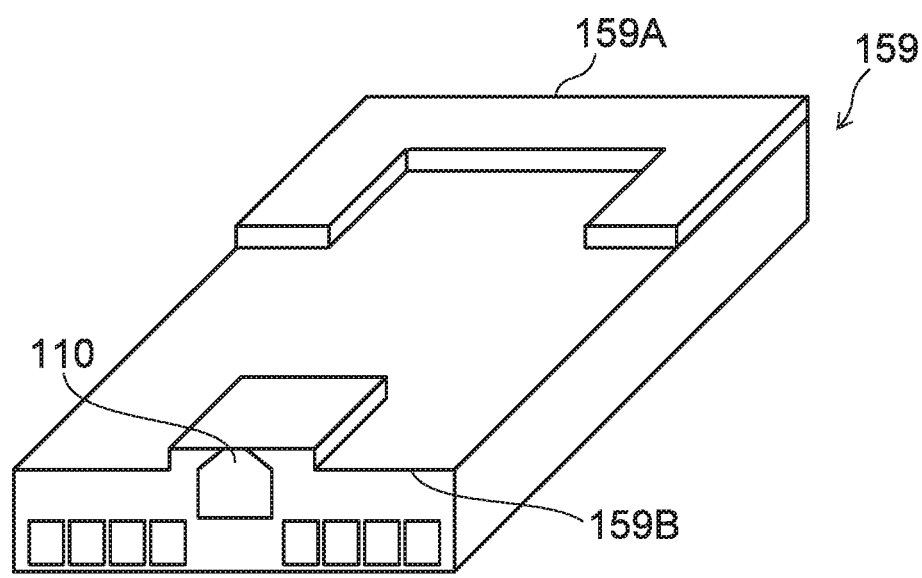
FIG. 6 is a schematic perspective view illustrating the magnetic head according to the embodiment.

As shown in FIG. 6, the magnetic head 110 is provided in the head slider 159. The head slider 159 includes, for example, $Al_2O_3$/TiC, etc. The head slider 159 moves relative to the magnetic recording medium 80 while flying over or contacting the magnetic recording medium 80.

The head slider 159 has, for example, an air inflow side 159A and an air outflow side 159B. The magnetic head 110 is disposed at the side surface of the air outflow side 159B of the head slider 159 or the like. Thereby, the magnetic head 110 moves relative to the magnetic recording medium while flying over or contacting the magnetic recording medium.

Figure 7A:
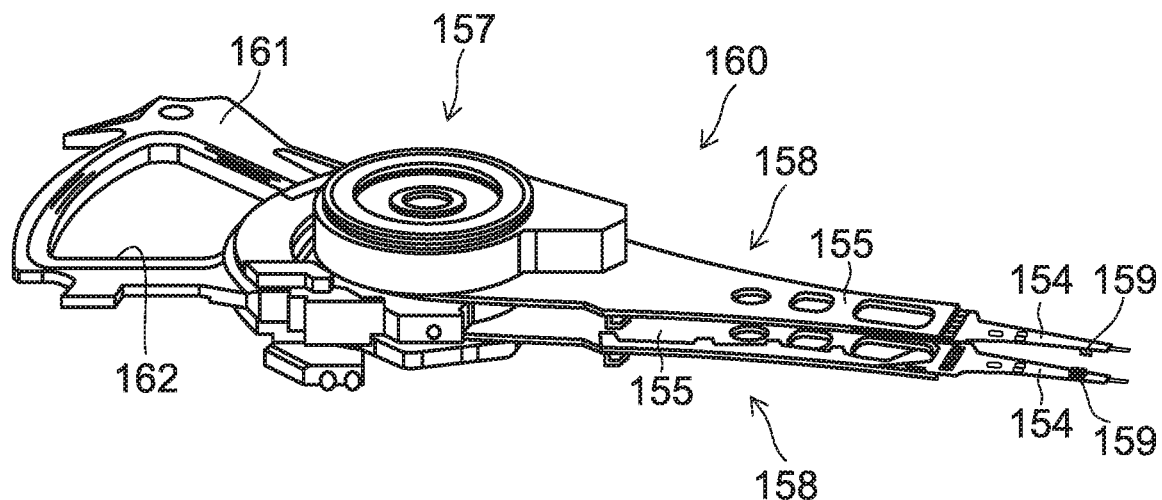
FIG. 7A, and FIG. 7B are schematic perspective views illustrating the magnetic head according to the embodiment.
Figure 7B:
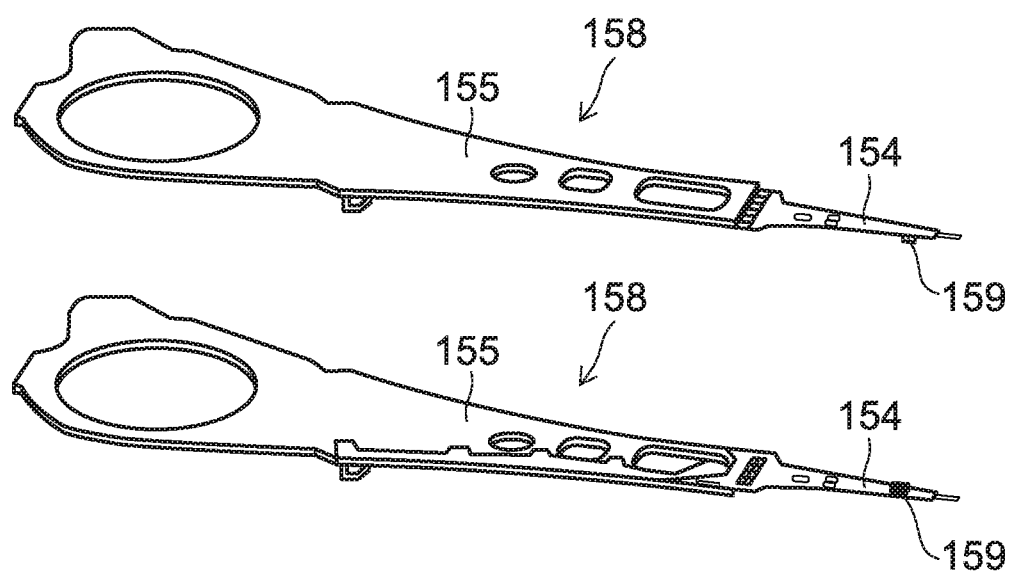

FIG. 7A illustrates the configuration of a portion of the magnetic recording device, and is a perspective view of a head stack assembly 160. FIG. 7B is a perspective view illustrating the magnetic head assembly (head gimbal assembly (HGA)) 158 which is a portion of the head stack assembly 160.

As shown in FIG. 7A, the head stack assembly 160 includes a bearing part 157, the head gimbal assembly 158, and a support frame 161. The head gimbal assembly 158 extends from the bearing part 157. The support frame 161 extends from the bearing part 157. The direction in which the support frame 161 extends is the reverse of the direction in which the head gimbal assembly 158 extends. For example, the support frame 161 supports a coil 162 of a motor.

As shown in FIG. 7B, the head gimbal assembly 158 includes an arm 155 extending from the bearing part 157, and a suspension 154 extending from the arm 155.

The head slider 159 is provided at the tip of the suspension 154. The magnetic head 110 according to the embodiment is provided at the head slider 159.

The magnetic head assembly (the head gimbal assembly) 158 according to the embodiment includes the magnetic head 110 according to the embodiment, the head slider 159 on which the magnetic head 110 is provided, the suspension 154, and the arm 155. The head slider 159 is provided at one end of the suspension 154. The arm 155 is connected to the other end of the suspension 154.

The embodiments include, for example, the following configurations (e.g., technological proposals).

Configuration 1

A method for evaluating a magnetic head, comprising:
measuring an electrical characteristic of a current path when an alternating-current magnetic field is applied to the magnetic head, the magnetic head including the current path, the current path including an oscillator; and
based on the electrical characteristic, deriving a frequency value relating to an oscillation frequency of the oscillator.

Configuration 2

The method for evaluating the magnetic head according to Configuration 1, wherein the measuring of the electrical characteristic includes modifying a frequency of the alternating-current magnetic field and measuring the electrical characteristic.

Configuration 3

The method for evaluating the magnetic head according to Configuration 2, wherein a minimum value and a maximum value of the modifying of the frequency are included in a range not less than 1 GHz and not more than 100 GHz.

Configuration 4

The method for evaluating the magnetic head according to Configuration 1, wherein
the measuring of the electrical characteristic includes deriving:
a first value of the electrical characteristic when a first alternating-current magnetic field of a first frequency is applied to the magnetic head;
a second value of the electrical characteristic when a second alternating-current magnetic field of a second frequency is applied to the magnetic head, the second frequency being higher than the first frequency; and
a third value of the electrical characteristic when a third alternating-current magnetic field of a third frequency is applied to the magnetic head, the third frequency being between the first frequency and the second frequency, and the third value is between the first value and the second value.

Configuration 5

The method for evaluating the magnetic head according to Configuration 4, wherein
the measuring of the electrical characteristic further includes deriving a fourth value of the electrical characteristic when a fourth alternating-current magnetic field of a fourth frequency is applied to the magnetic head, the fourth frequency being lower than the first frequency, and
the fourth value is between the first value and the second value.

Configuration 6

The method for evaluating the magnetic head according to Configuration 5, wherein an absolute value of a difference between the fourth value and a value of the electrical characteristic corresponding to the frequency value relating to the oscillation frequency is less than an absolute value of the first value and less than an absolute value of the second value.

Configuration 7
The method for evaluating the magnetic head according to Configuration 6, wherein
the measuring of the electrical characteristic further includes deriving a fifth value of the electrical characteristic when a fifth alternating-current magnetic field of a fifth frequency is applied to the magnetic head, the fifth frequency being higher than the second frequency, and
the fifth value is between the first value and the second value.

Configuration 8
The method for evaluating the magnetic head according to Configuration 7, wherein an absolute value of a difference between the fifth value and the value of the electrical characteristic corresponding to the frequency value relating to the oscillation frequency is less than the absolute value of the first value and less than the absolute value of the second value.

Configuration 9
The method for evaluating the magnetic head according to Configuration 4, wherein a value of the electrical characteristic corresponding to the frequency value relating to the oscillation frequency is between the first value and the second value.

Configuration 10
The method for evaluating the magnetic head according to Configuration 1, wherein
the measuring of the electrical characteristic includes a first measurement and a second measurement,
the first measurement includes measuring the electrical characteristic of the magnetic head while applying the alternating-current magnetic field to the magnetic head, and
the second measurement includes measuring the electrical characteristic of the magnetic head while not applying the alternating-current magnetic field to the magnetic head, or measuring the electrical characteristic of the magnetic head while setting a strength of the alternating-current magnetic field to be lower than a strength of the alternating-current magnetic field in the first measurement.

Configuration 11
The method for evaluating the magnetic head according to Configuration 10, wherein
the measuring of the electrical characteristic includes performing a plurality of measurement processing, and
one of the plurality of measurement processing includes the first measurement and the second measurement.

Configuration 12
The method for evaluating the magnetic head according to Configuration 11, wherein the plurality of measurement processing is performed periodically.

Configuration 13
The method for evaluating the magnetic head according to any one of Configurations 1 to 12, wherein
the measuring of the electrical characteristic includes supplying an alternating current to a first conductive body, and
the alternating-current magnetic field based on the alternating current is applied to the magnetic head.

Configuration 14
The method for evaluating the magnetic head according to any one of Configurations 1 to 13, wherein the electrical characteristic corresponds to an electrical resistance of the current path when a direct current flows in the current path.

Configuration 15
The method for evaluating the magnetic head according to Configuration 14, wherein the oscillator oscillates when the direct current flows.

Configuration 16
An evaluation apparatus of a magnetic head, comprising:
a first conductive body;
a holder configured to hold the magnetic head and configured to control a position of the magnetic head with respect to the first conductive body, the magnetic head including a current path including an oscillator;
a current supply circuit configured to supply an alternating current to the first conductive body; and
a measurement circuit configured to measure an electrical characteristic of the current path.

Configuration 17
The evaluation apparatus of the magnetic head according to Configuration 16, further comprising a processor, the processor being configured to derive, based on the electrical characteristic, a frequency value relating to an oscillation frequency of the oscillator.

Configuration 18
The evaluation apparatus of the magnetic head according to Configuration 16 or 17, wherein
the measuring of the electrical characteristic includes a first measurement and a second measurement,
the first measurement includes measuring the electrical characteristic of the magnetic head while applying the alternating-current magnetic field to the magnetic head, and
the second measurement includes measuring the electrical characteristic of the magnetic head while not applying the alternating-current magnetic field to the magnetic head, or measuring the electrical characteristic of the magnetic head while setting a strength of the alternating-current magnetic field to be lower than a strength of the alternating-current magnetic field in the first measurement.

Configuration 19
The evaluation apparatus of the magnetic head according to Configuration 18, wherein
the measuring of the electrical characteristic includes performing a plurality of measurement processing, and
one of the plurality of measurement processing includes the first measurement and the second measurement.

Configuration 20
The evaluation apparatus of the magnetic head according to Configuration 19, wherein the plurality of measurement processing is performed periodically.

Configuration 21
The evaluation apparatus of the magnetic head according to any one of Configurations 16 to 20, wherein
the magnetic head further includes a reproducing portion, and
the holder is configured to control, based on a signal, the position of the magnetic head with respect to the first conductive body, the signal being obtained from the reproducing portion when a current is supplied to the current supply circuit.

Configuration 22
The evaluation apparatus of the magnetic head according to Configuration 16 or 17, wherein the measuring of the electrical characteristic includes modifying a frequency of the alternating-current magnetic field and measuring the electrical characteristic.

Configuration 23
The evaluation apparatus of the magnetic head according to Configuration 22, wherein a minimum value and a maximum value of the modifying of the frequency are included in a range not less than 1 GHz and not more than 100 GHz.

Configuration 24
The evaluation apparatus of the magnetic head according to Configuration 17, wherein the measuring of the electrical characteristic includes deriving:
a first value of the electrical characteristic when a first alternating-current magnetic field of a first frequency is applied to the magnetic head;
a second value of the electrical characteristic when a second alternating-current magnetic field of a second frequency is applied to the magnetic head, the second frequency being higher than the first frequency; and
a third value of the electrical characteristic when a third alternating-current magnetic field of a third frequency is applied to the magnetic head, the third frequency being between the first frequency and the second frequency, and
the third value is between the first value and the second value.

Configuration 25

The evaluation apparatus of the magnetic head according to Configuration 24, wherein
the measuring of the electrical characteristic further includes deriving a fourth value of the electrical characteristic when a fourth alternating-current magnetic field of a fourth frequency is applied to the magnetic head, the fourth frequency being lower than the first frequency, and
the fourth value is between the first value and the second value.

Configuration 26

The evaluation apparatus of the magnetic head according to Configuration 25, wherein an absolute value of a difference between the fourth value and a value of the electrical characteristic corresponding to the frequency value relating to the oscillation frequency is less than an absolute value of the first value and less than an absolute value of the second value.

Configuration 27

The evaluation apparatus of the magnetic head according to Configuration 26, wherein
the measuring of the electrical characteristic further includes deriving a fifth value of the electrical characteristic when a fifth alternating-current magnetic field of a fifth frequency is applied to the magnetic head, the fifth frequency being higher than the second frequency, and the fifth value is between the first value and the second value.

Configuration 28

The evaluation apparatus of the magnetic head according to Configuration 27, wherein an absolute value of a difference between the fifth value and the value of the electrical characteristic corresponding to the frequency value relating to the oscillation frequency is less than the absolute value of the first value and less than the absolute value of the second value.

Configuration 29

The evaluation apparatus of the magnetic head according to Configuration 24, wherein a value of the electrical characteristic corresponding to the frequency value relating to the oscillation frequency is between the first value and the second value.

Configuration 30

The evaluation apparatus of the magnetic head according to any one of Configurations 16 to 29, wherein the electrical characteristic corresponds to an electrical resistance of the current path when a direct current flows in the current path.

Configuration 31

The evaluation apparatus of the magnetic head according to Configuration 20, wherein the oscillator oscillates when the direct current flows.

According to the embodiments, a method for evaluating a magnetic head and an evaluation apparatus of the magnetic head can be provided in which the oscillation frequency can be evaluated.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in evaluation apparatuses of magnetic heads such as conductive bodies, holders, current supply circuits, measurement circuits, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for evaluating magnetic heads, and evaluating apparatuses of magnetic heads practicable by an appropriate design modification by one skilled in the art based on the methods for evaluating magnetic heads, and the evaluating apparatuses of magnetic heads described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for evaluating a magnetic head, comprising:
measuring an electrical characteristic of a current path when an alternating-current magnetic field is applied to the magnetic head, the magnetic head including the current path, the current path including an oscillator; and
based on the electrical characteristic, deriving a frequency value relating to an oscillation frequency of the oscillator.

2. The method according to claim 1, wherein the measuring of the electrical characteristic includes modifying a frequency of the alternating-current magnetic field and measuring the electrical characteristic.

3. The method according to claim 2, wherein a minimum value and a maximum value of the modifying of the frequency are included in a range not less than 1 GHz and not more than 100 GHz.

4. The method according to claim 1, wherein
the measuring of the electrical characteristic includes deriving:
a first value of the electrical characteristic when a first alternating-current magnetic field of a first frequency is applied to the magnetic head;

a second value of the electrical characteristic when a second alternating-current magnetic field of a second frequency is applied to the magnetic head, the second frequency being higher than the first frequency; and a third value of the electrical characteristic when a third alternating-current magnetic field of a third frequency is applied to the magnetic head, the third frequency being between the first frequency and the second frequency, and the third value is between the first value and the second value.

5. The method according to claim 4, wherein
the measuring of the electrical characteristic further includes deriving a fourth value of the electrical characteristic when a fourth alternating-current magnetic field of a fourth frequency is applied to the magnetic head, the fourth frequency being lower than the first frequency, and
the fourth value is between the first value and the second value.

6. The method according to claim 5, wherein an absolute value of a difference between the fourth value and a value of the electrical characteristic corresponding to the frequency value relating to the oscillation frequency is less than an absolute value of the first value and less than an absolute value of the second value.

7. The method according to claim 6, wherein
the measuring of the electrical characteristic further includes deriving a fifth value of the electrical characteristic when a fifth alternating-current magnetic field of a fifth frequency is applied to the magnetic head, the fifth frequency being higher than the second frequency, and
the fifth value is between the first value and the second value.

8. The method according to claim 7, wherein an absolute value of a difference between the fifth value and the value of the electrical characteristic corresponding to the frequency value relating to the oscillation frequency is less than the absolute value of the first value and less than the absolute value of the second value.

9. The method according to claim 4, wherein a value of the electrical characteristic corresponding to the frequency value relating to the oscillation frequency is between the first value and the second value.

10. The method according to claim 1, wherein
the measuring of the electrical characteristic includes a first measurement and a second measurement,
the first measurement includes measuring the electrical characteristic of the magnetic head while applying the alternating-current magnetic field to the magnetic head, and
the second measurement includes measuring the electrical characteristic of the magnetic head while not applying the alternating-current magnetic field to the magnetic head, or measuring the electrical characteristic of the magnetic head while setting a strength of the alternating-current magnetic field to be lower than a strength of the alternating-current magnetic field in the first measurement.

11. The method according to claim 10, wherein
the measuring of the electrical characteristic includes performing a plurality of measurement processing, and
one of the plurality of measurement processing includes the first measurement and the second measurement.

12. The method according to claim 11, wherein the plurality of measurement processing is performed periodically.

13. The method according to claim 1, wherein
the measuring of the electrical characteristic includes supplying an alternating current to a first conductive body, and
the alternating-current magnetic field based on the alternating current is applied to the magnetic head.

14. The method according to claim 1, wherein the electrical characteristic corresponds to an electrical resistance of the current path when a direct current flows in the current path.

15. The method according to claim 14, wherein the oscillator oscillates when the direct current flows.

16. An evaluation apparatus of a magnetic head, comprising:
a first conductive body;
a holder configured to hold the magnetic head and configured to control a position of the magnetic head with respect to the first conductive body, the magnetic head including a current path including an oscillator;
a current supply circuit configured to supply an alternating current to the first conductive body; and
a measurement circuit configured to measure an electrical characteristic of the current path.

17. The apparatus according to claim 16, further comprising a processor,
the processor being configured to derive, based on the electrical characteristic, a frequency value relating to an oscillation frequency of the oscillator.

18. The apparatus according to claim 16, wherein
the measuring of the electrical characteristic includes a first measurement and a second measurement,
the first measurement includes measuring the electrical characteristic of the magnetic head while applying the alternating-current magnetic field to the magnetic head, and
the second measurement includes measuring the electrical characteristic of the magnetic head while not applying the alternating-current magnetic field to the magnetic head, or measuring the electrical characteristic of the magnetic head while setting a strength of the alternating-current magnetic field to be lower than a strength of the alternating-current magnetic field in the first measurement.

19. The apparatus according to claim 18, wherein
the measuring of the electrical characteristic includes performing a plurality of measurement processing, and
one of the plurality of measurement processing includes the first measurement and the second measurement.

20. The apparatus according to claim 19, wherein the plurality of measurement processing is performed periodically.

* * * * *